(12) United States Patent
Howell

(10) Patent No.: US 7,753,695 B2
(45) Date of Patent: Jul. 13, 2010

(54) SOCKET WITH WIRE-SHAPED CONTACTS

(75) Inventor: David Gregory Howell, Gilbert, AZ (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 122 days.

(21) Appl. No.: 12/080,294

(22) Filed: Apr. 2, 2008

(65) Prior Publication Data

US 2009/0253279 A1 Oct. 8, 2009

(51) Int. Cl.
*H01R 12/00* (2006.01)
(52) U.S. Cl. ..................... 439/82; 439/66; 439/733.1
(58) Field of Classification Search ............... 439/82, 439/66, 733.1, 83, 943, 930, 862, 876, 75
See application file for complete search history.

(56) References Cited

U.S. PATENT DOCUMENTS

| | | | | |
|---|---|---|---|---|
| 5,415,559 A | * | 5/1995 | Ichimura | 439/259 |
| 5,470,245 A | * | 11/1995 | Ichimura | 439/259 |
| 5,749,752 A | * | 5/1998 | Kashiyama et al. | 439/733.1 |
| 7,254,889 B1 | * | 8/2007 | Cherian | 29/874 |
| 7,435,102 B2 | * | 10/2008 | Goodman | 439/70 |

\* cited by examiner

*Primary Examiner*—Tho D Ta
*Assistant Examiner*—Travis Chambers
(74) *Attorney, Agent, or Firm*—Andrew C. Cheng; Wei Te Chung; Ming Chieh Chang

(57) ABSTRACT

A socket connector, for electrically connecting an IC package and a printed circuit board, comprises a base having a plurality of through holes, a cover mounted on the base and having a top plate, a plurality of wire-shape contacts bent from a metal haulm and an adapter assembled below the base. The contact has a contacting portion inserting into the top plate of the cover, a tail retained to the base and an elastic center portion connecting the contacting portion and the tail, the center portion is located between the base and the top plate of the cover. The adapter receives the tails of the contacts and has a plurality of exposed solder balls electrically connecting the tails.

17 Claims, 5 Drawing Sheets

SOCKET WITH WIRE-SHAPED CONTACTS

BACKGROUND OF THE INVENTION

1. Field of the Invention

The present invention relates to a socket connector, which is used for connecting an electronic package, such as a central processing unit (CPU), with a circuit substrate, such as a printed circuit board (PCB).

2. Description of the Prior Art

Contacts for conventional socket connectors, which are used in electrically connecting a semiconductor package and a PCB, are stamped from a metal piece. Some other socket connectors may adopt other contacts with simple configures, such as conductive spring contact. Socket connector with conductive spring contacts has an insulative base, the insulative base defines a plurality of through holes, which is defined with a narrow diameter in a center thereof to retain a center part of the spring contact. The conductive spring contact is accommodated in the corresponding through hole, and a top and a bottom parts of the spring contact protrude out of the insulative base to electrically contact the semiconductor package and the PCB, respectively. However, manufacturing the spring contacts may not be easy things.

Accordingly, a socket connector that solves the above problems is desirable.

SUMMARY OF THE INVENTION

Accordingly, an object of the present invention is to provide a socket connector, which has wire-shaped contacts.

To fulfill the above object, a socket connector for electrically an IC package and a printed circuit board comprises: a base defining a plurality of through holes; a cover mounted upon the base and formed with a top plate defining a plurality of holes corresponding to the through holes of the base; and a plurality of contacts. The contact is bent from a metal haulm and has an elastic center portion, a contacting portion upwardly extending from a top end of the center portion, and a tail downwardly extending from a bottom end of the center portion. The contacting portion inserts into the hole of the cover; the tail is retained to the through holes of the base; and the center portion is located between the base and the top plate of the cover to provide an elastic force for upwardly urging the contacting portion when the IC package put on the cover.

Other objects, advantages and novel features of the present invention will become more apparent from the following detailed description when taken in conjunction with the accompanying drawings, in which:

DESCRIPTION OF PREFERRED EMBODIMENTS OF THE INVENTION

Reference is now made to the drawings to describe the invention in detail.

Figure 1:
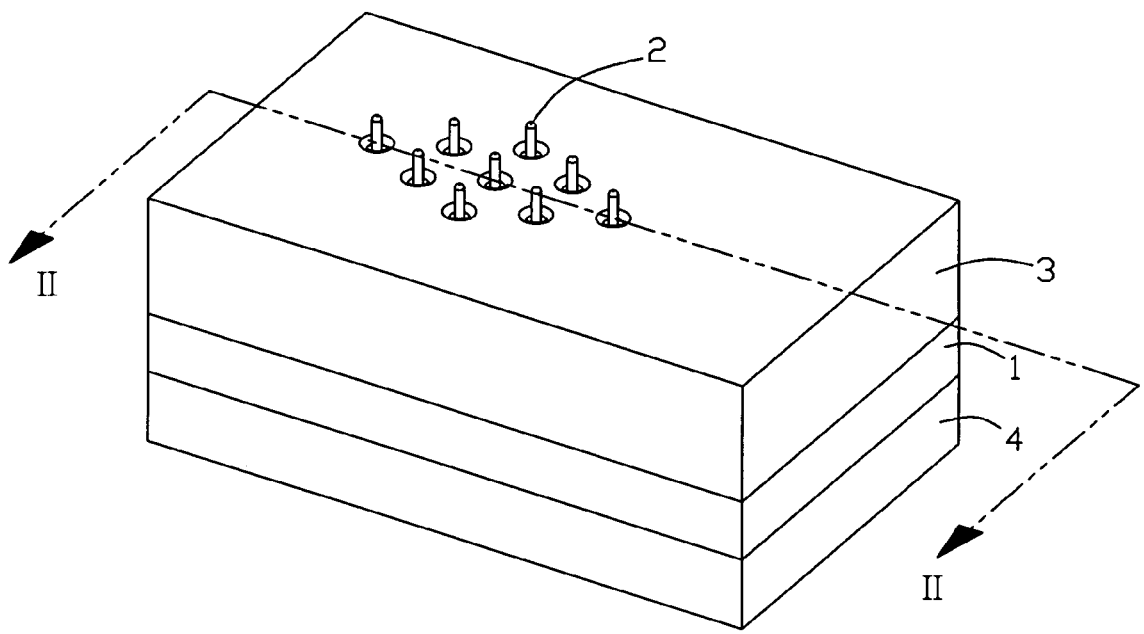
FIG. 1 is a perspective, assembly view of a socket connector in a preferred embodiment according to the present invention.
Figure 2:
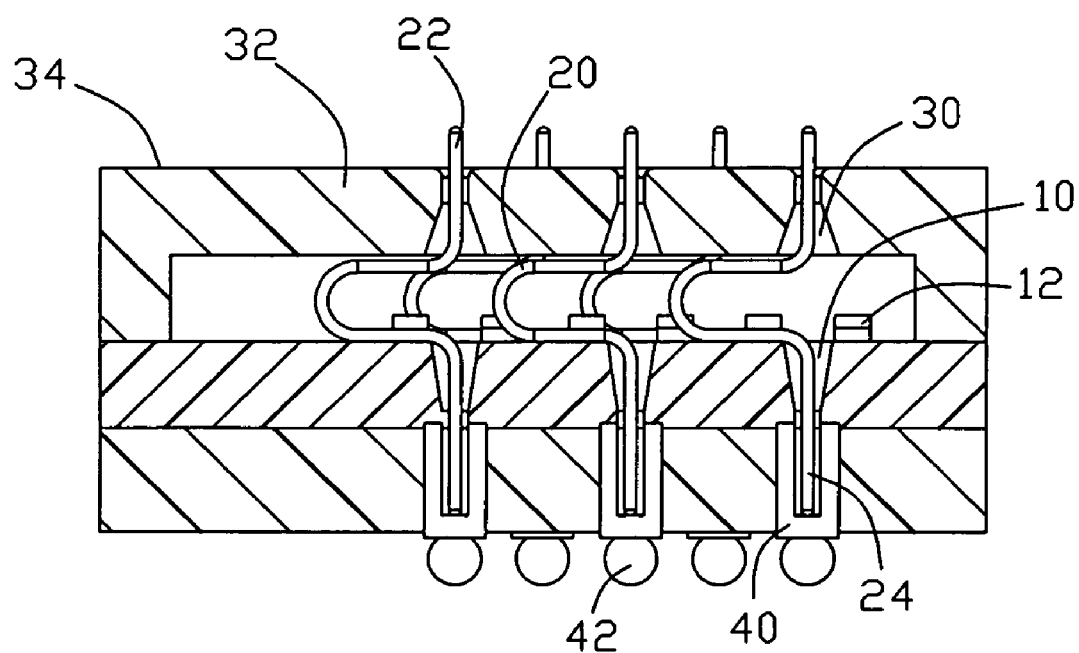
FIG. 2 is a section view of the socket connector in FIG. 1.
Figure 3:
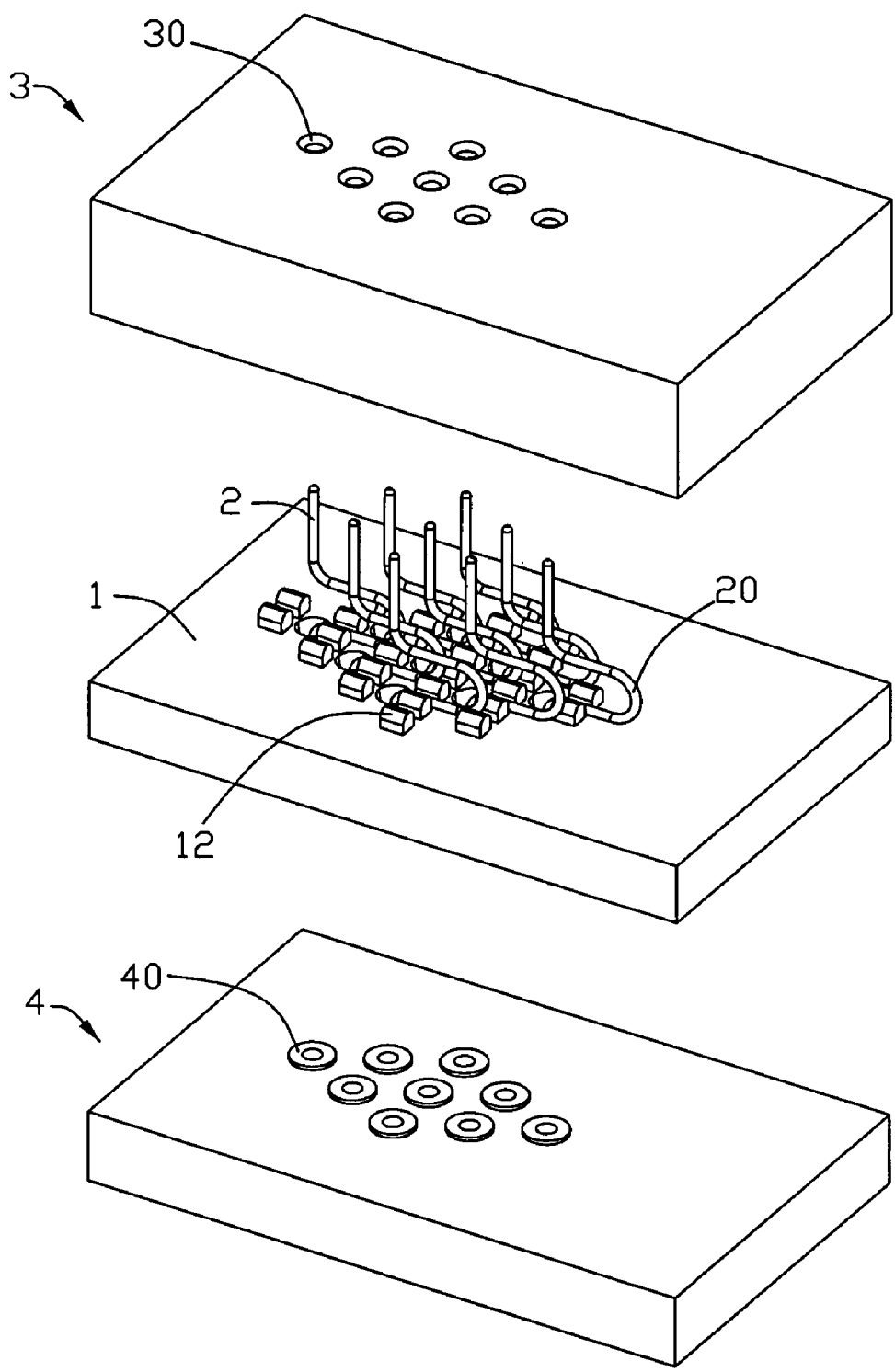
FIG. 3 is a partially, exploded view of the socket connector.

Referring to FIGS. 1-3, a socket connector in a preferred embodiment according to the present invention comprises a base 1, a plurality of contacts 2 assembled to the base 1, a cover 3 upon the base 1 and an adapter 4 below the base 1.

The base 1 is an approximate rectangle board, and has a plurality of through holes 10 defining therethrough and a plurality of ribs 12 arranged on a top face 16 thereof and being besides the through holes 10. The through holes 10 and the ribs 12 are arranged in rows, respectively, and a row of the through holes 10 is disposed between two adjacent rows of ribs 12. The through hole 10 is substantially cone-shaped with a wide diameter in a top thereof and a narrow diameter in a bottom thereof. Furthermore, the through holes 10 are staggered arrayed in two adjacent rows to keep as large as possible distance between two neighboring through holes 10 in different rows, that benefits arrangement of the contacts 20.

Figure 4:
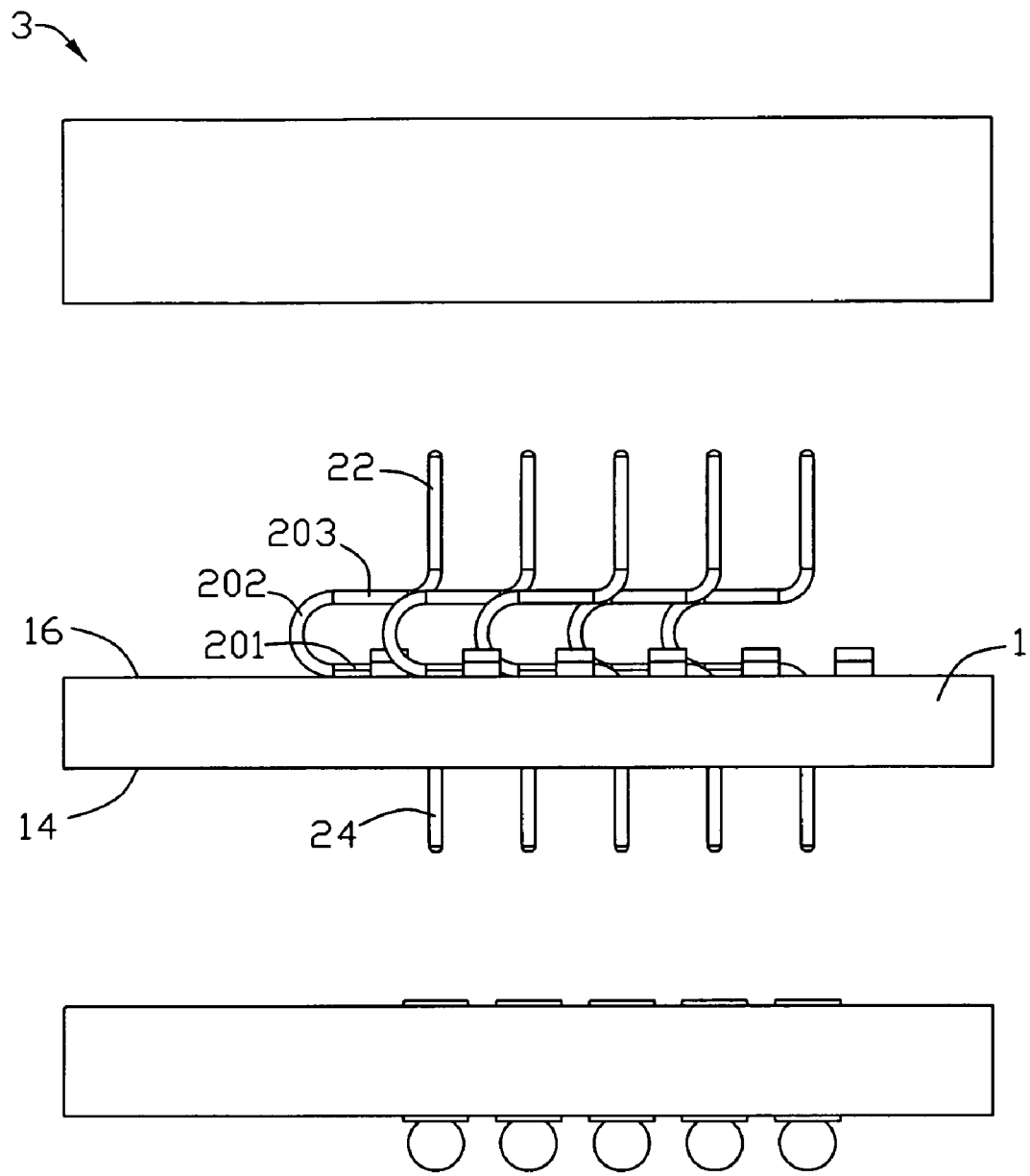
FIG. 4 is a side view of the socket connector in FIG. 3.
Figure 5:
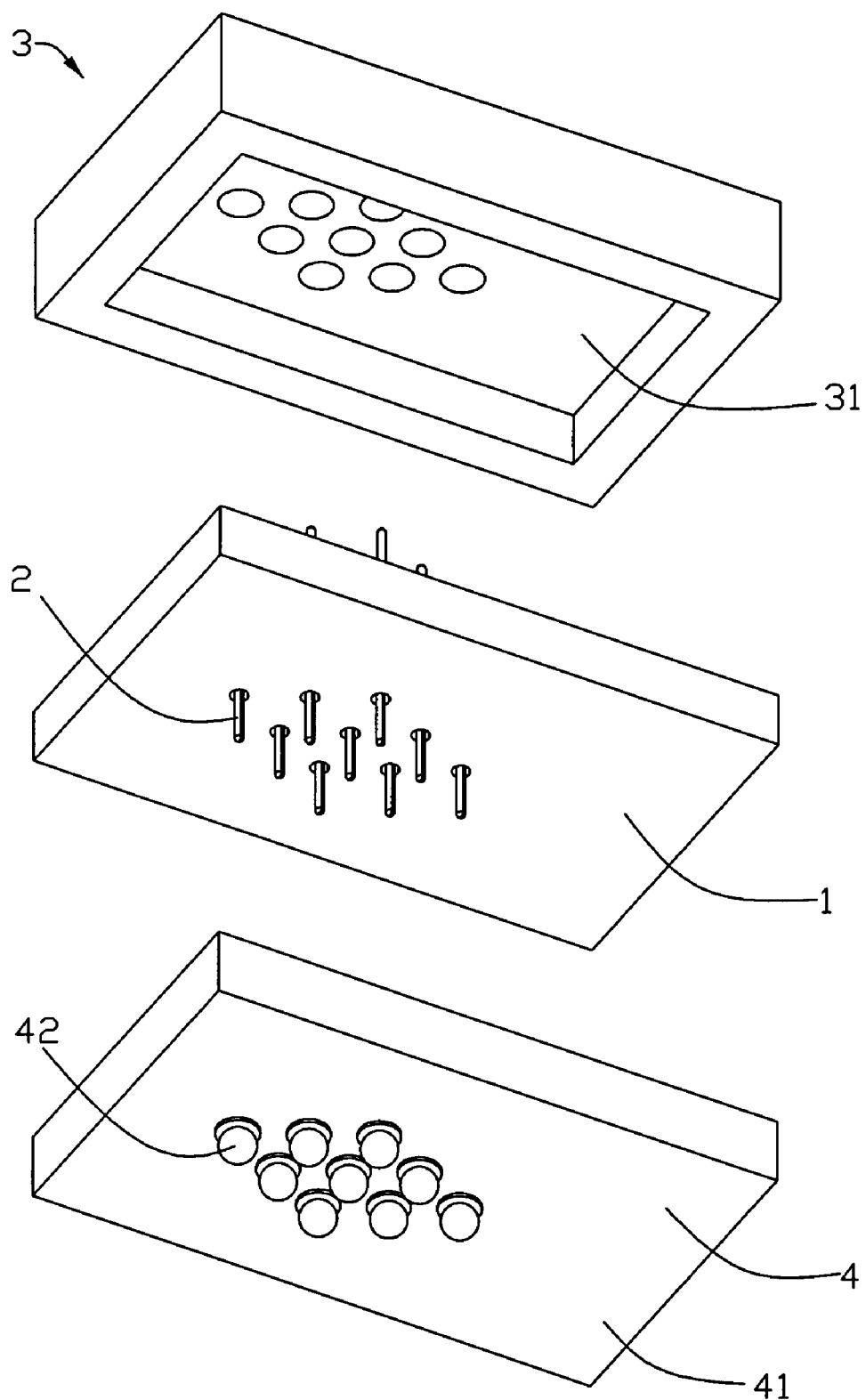
FIG. 5 is similar with FIG. 3, but taken from a bottom side.

Referring to FIGS. 2-4, the contact 2 is formed by bending a wire-shaped metal haulm several times, and is different from contacts (not shown) stamped from metal piece, so the contact 2 has enough intensity and may not be easily destroyed. The contact 2 has an elastic center portion 20, a contacting portion 22 upwardly extending from a top end of the center portion 20, and a tail 24 downwardly extending from a bottom end of the center portion 20. The contacting portion 22 and the tail 24 of the contact 2 align with each other along an upright direction. The center portion 20 has a horizontal bottom arm 201, an arc portion 202 upwardly bent from an end of the bottom arm 201, and a horizontal top arm 203 bent from a top end of the arc portion 204. The bottom arm 201, the arc portion 202 and the top arm 203 forms a traverse U-shape, so the center portion 20 has a desirable elasticity. The contact 2 inserts into the corresponding through hole 10 of the base 1 from a top side, the tail 24 extends out of a bottom face 14 of the base 1, the bottom arm 201 of the center portion 20 locates on the top face 16 of the base 1 and is positioned by two adjacent rows of ribs 12 to prevent the contact 2 from swinging. The bottom arm 201 horizontally extends from corresponding through holes 10, and passes by an adjacent through hole 10 in adjacent row, but does not arrive an adjacent through hole 10 in a same row.

Referring to FIGS. 2-5, the cover 3 like a box without a bottom plate and define a space 31. The cover 3 has a top plate 32, and is formed with a plurality of holes 30 corresponding to the through holes 10 of the base 1. The hole 30 is substantially cone-shaped with a wide diameter in a bottom thereof and a narrow diameter in a top thereof and aligns with corresponding through hole 10 of the base 1 in the upright direction. The cover 3 is mounted on and supported by the base 1 and covers the contacts 2 assembled on the base 1. The contacting portions 22 of the contacts 2 pass through the holes 30 of the cover 3 and protrude out of a top surface 34 of the cover 3 for electrically contacting with an IC package (not shown). The center portions 20 are located between the top plate 32 and the base 1 and received in the space 31 of the cover 3. The center portion 20 provides an elastic force for upwardly urging the contacting portion 22 when the IC package (not shown) put on the cover 3.

If the socket connector is mounted on a printed circuit board (not shown) by through-hole technology, the adapter 4 is not needed to be assembled to the base 1. The base 1, together with the cover 3 and the contacts 2, is mounted to the printed circuit board (not shown) directly and the tails 24 of the contacts 2 insert into and are soldered with passageways (not shown) on the printed circuit board (not shown). The IC package thus electrically connects with the printed circuit board.

If the socket connector is mounted on a printed circuit board (not shown), which has a plurality of conductive pads (not shown), by BGA (Ball Gray Array) technology, the adapter 4 will need to be assembled to the base 1. The adapter 4 is approximate board-shape. The adapter 4 is formed with an insulative housing 41, a plurality of conductive tubes 40 passing through the insulative housing 41 and a plurality of exposed solder balls 42 soldered to a bottom face of each conductive tube 40. The conductive tubes 40 are embedded in of the insulative housing 41 in an injection molding process. The adapter 4 is assembled to the base 1 from a bottom side, the tails 24 of the contacts 2 are received in and soldered to the corresponding conductive tubes 40. And then, the socket connector mounts to the printed circuit board (not shown), the balls 42 electrically contact with the pads (not shown) on the printed circuit board (not shown), so the IC package electrically connects with the printed circuit board.

Furthermore, although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. A socket connector, for electrically connecting an IC package and a printed circuit board, comprising:
   a base having a plurality of through holes;
   a cover mounted upon the base and formed with a top plate defining a plurality of holes corresponding to the through holes of the base; and
   a plurality of wire-shape contacts, configured by a metal haulm, and each having an elastic center portion, a contacting portion upwardly extending from a top end of the center portion, and a tail downwardly extending from a bottom end of the center portion, the contacting portion inserting into the hole of the cover, the tail being retained to the through holes of the base; and the center portion being located between the base and the top plate of the cover and providing an elastic force for upwardly urging the contacting portion when the IC package put on the cover, wherein the center portion has a horizontal bottom arm, an arc portion upwardly bent from an end of the bottom arm, and a horizontal top arm extending from a top end of the arc portion.

2. The socket connector of claim 1, wherein the contacting portion and the tail of the contact align with each other along an upright direction, the through holes of the base and the holes of the cover for the contacts are in cone-shaped.

3. The socket connector of claim 1, wherein the bottom arm of the center portion is located on a top face of the base.

4. The socket connector of claim 3, wherein the bottom arm, the arc portion and the top arm forms a U-shape, so the center portion has a well elasticity.

5. The socket connector of claim 3, wherein the base has a plurality of ribs besides two opposed sides of each through hole, the bottom arm of the center portion is limited by adjacent ribs to prevent the contact from swinging.

6. The socket connector of claim 3, further comprising an adapter, the adapter is assembled to the base from a bottom side and receives the tails of the contacts, and wherein the adapter has a plurality of exposed solder balls electrically connecting with corresponding tails of the contacts and adapted for being mounted to the print circuit board.

7. The socket connector of claim 6, wherein the adapter has a plurality of conductive tubes, which receive and electrically connecting with the tails of the contacts, and the solder balls are disposed on bottom surfaces of the tubes.

8. The socket connector of claim 1, wherein the top arm and the bottom arm of the contact are parallel to each other and adjacent to the top plate of the cover and the base respectively.

9. The socket connector of claim 8, wherein the cover is mounted on and supported by the base, the cover is box-like without bottom and defines a space below the top plate for receiving the center portions of the contacts.

10. A socket connector, for electrically an IC package and a printed circuit board, comprising:
    a base having a plurality of through holes;
    a plurality of contacts received in the through holes of the base, the contact having a tail downwardly protruding out of the base; and
    an adapter assembled to the base from a bottom side of the base and receiving the tails of the contacts, the adapter having a plurality of exposed solder balls electrically connecting the tails of the contacts wherein the contact is a wire-shaped and is configured by a metal haulm; wherein the contact has a contacting portion and an elastic center portion, the tail downwardly extends from a bottom end of the center portion and the contacting portion upwardly extends from a top end of the center portion, the elastic center portion is of U-shape with a horizontal bottom arm, an arc portion upwardly bent from an end of the bottom arm, and a horizontal top arm extending from a top end of the arc portion.

11. The socket connector of claim 10, wherein the adapter has a plurality of conductive tubes which receive and electrically contact with the tails of the contacts, the soldered balls are disposed on bottom surfaces of the tubes to electrically connect the contacts with pads on the printed circuit.

12. The socket connector of claim 10, further comprising a cover mounted upon the base with a top plate, the center portions of the contacts are located between the top plate and the base, the contacting portions of the contacts protrude out of the top plate to contact with the IC package.

13. The socket connector of claim 12, wherein the through holes of the base are staggered arrayed in two adjacent rows.

14. A socket connector comprising:
    an insulative base defining a plurality of first passageways;
    an insulative cover defining a plurality of second passageways corresponding to the first passageways, respectively;
    a huge common space formed between the base and the cover;
    a plurality of contacts each defining a main body located in the common space with opposite first and second ends respectively extending through the corresponding first and second passageways in a free manner, and beyond a bottom face of the base and a top face of the cover, respectively;
    an adaptor attached under the bottom face of the base and having a plurality of embedded conductive tubes each defining an upward opening to receive the first end of the corresponding contact, and a solder ball attached under a bottom end of each of said tubes and exposed under a bottom face of the adaptor wherein the main body of the contact is of a U-shaped configuration having an upper arm abutting against a bottom face of the cover, which downwardly faces the common space, and a lower arm abutting against an upper face of the base, which upwardly faces the common space.

15. The socket connector as claimed in claim 14, wherein an upper face of the base, which upwardly faces the common space, define a plurality of constraint devise to keep the main bodies of the corresponding contacts in position, respectively.

16. The socket connector as claimed in claim 14, wherein both said first passageways and said second passageways extend vertically for implementation of said free manner.

17. The socket connector as claimed in claim 16, wherein both said first passageways and said second passageways define chamfered openings facing toward the common space.

* * * * *